United States Patent
Chen et al.

(10) Patent No.: US 10,504,564 B2
(45) Date of Patent: Dec. 10, 2019

(54) SYSTEMS FOR VOLTAGE REGULATION USING SIGNAL BUFFERS AND RELATED METHODS

(71) Applicant: MediaTek Inc., Hsin-Chu (TW)

(72) Inventors: Wei-Chung Chen, Hsin-Chu (TW);
Tzu-Chi Huang, Hsin-Chu (TW);
Kuo-Chun Hsu, Hsin-Chu (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 16/110,936

(22) Filed: Aug. 23, 2018

(65) Prior Publication Data

US 2019/0080729 A1    Mar. 14, 2019

Related U.S. Application Data

(60) Provisional application No. 62/596,979, filed on Dec. 11, 2017, provisional application No. 62/558,375, filed on Sep. 14, 2017.

(51) Int. Cl.
*G11C 5/14* (2006.01)
*G05F 1/59* (2006.01)
(Continued)

(52) U.S. Cl.
CPC .............. *G11C 5/147* (2013.01); *G05F 1/575* (2013.01); *G05F 1/59* (2013.01); *H03F 3/16* (2013.01);
(Continued)

(58) Field of Classification Search
CPC . G11C 5/147; G05F 1/575; G05F 1/59; H03F 3/16; H03F 3/505; H03F 2200/69
(Continued)

(56) References Cited

U.S. PATENT DOCUMENTS

2006/0164053 A1    7/2006   Walter et al.
2008/0174289 A1    7/2008   Gurcan et al.
(Continued)

FOREIGN PATENT DOCUMENTS

TW    200836038 A    9/2008
TW    200925817 A    6/2009
(Continued)

OTHER PUBLICATIONS

EP 18194272.3, Dec. 11, 2018, Extended European Search Report.
(Continued)

*Primary Examiner* — Huan Hoang
(74) *Attorney, Agent, or Firm* — Wolf, Greenfield & Sacks, P.C.

(57) ABSTRACT

Voltage regulators and related methods are described. The voltage regulators described in the application may include an operational amplifier, an output transistor, and a signal buffer connected between the operational amplifier and the output transistor. In some embodiments, these voltage regulators are used in connection with memory units. A voltage regulator may be arranged such that the signal amplifier clamps the voltage at the gate of the output transistor to the output voltage when the memory unit is in an idle mode. In this way, when the memory is accessed, the amplitude and duration of output voltage overshoots can be limited, relative to some voltage regulators.

17 Claims, 6 Drawing Sheets

(51) Int. Cl.
*G05F 1/575* (2006.01)
*H03F 3/16* (2006.01)
*H03F 3/50* (2006.01)

(52) U.S. Cl.
CPC ......... *H03F 3/505* (2013.01); *H03F 2200/69* (2013.01)

(58) Field of Classification Search
USPC ............................................ 365/226, 189.09
See application file for complete search history.

(56) References Cited

U.S. PATENT DOCUMENTS

| | | | | |
|---|---|---|---|---|
| 2011/0068758 A1* | 3/2011 | Chiu | ................. | G05F 1/575 323/280 |
| 2019/0011944 A1* | 1/2019 | Ono | ................. | G05F 1/565 |

FOREIGN PATENT DOCUMENTS

| | | |
|---|---|---|
| TW | 201145776 A | 12/2011 |
| TW | 1418147 B | 12/2013 |

OTHER PUBLICATIONS

Extended European Search Report dated Dec. 11, 2018 in connection with European Application No. EP 18194272.3.
Nammi et al., Split-transistor compensation: Application to a low-dropout voltage regulator (LDO). 2017 IEEE 60$^{th}$ International Midwest Symposium on Circuits and Systems (MWSCAS). IEEE. Aug. 6, 2017;XP033158269:1300-03.
Al-Shyoukh et al., A Transient-Enhanced Low-Quiescent Current Low-Dropout Regulator With Buffer Impedance Attenuation. IEEE Journal of Solid-State Circuits. Aug. 2007; 42(8): 1732-42.
Duong et al., Multiple-Loop Design Technique for High-Performance Low-Dropout Regulator. IEEE Journal of Solid-State Circuits. Oct. 2017; 52(10): 2533-49.
Ho et al., A CMOS Low-Dropout Regulator With Dominant-Pole Substitution. IEEE Transactions on Power Electronics. Sep. 2016; 31(9): 6362-71.
Ho et al., A Low-Power Fast-Transient 90-nm Low-Dropout Regulator With Multiple Small-Gain Stages. IEEE Journal of Solid-State Circuits. Nov. 2010; 45(11): 2466-75.
Maity et al., A Hybrid-Mode Operational Transconductance Amplifier for an Adaptively Biased Low Dropout Regulator. IEEE Transactions on Power Electronics. Feb. 2017; 32(2): 1245-54.

* cited by examiner

SYSTEMS FOR VOLTAGE REGULATION USING SIGNAL BUFFERS AND RELATED METHODS

This Application claims priority under 35 U.S.C. § 119(e) to U.S. Provisional Application Ser. No. 62/596,979, entitled "N-TYPE LOW-DROPOUT REGULATOR WITH POWER-RECYCLE AND INHERENT-VOLTAGE-CLAMPING TECHNIQUE FOR SHORT-PERIOD LOAD TRANSIENT" filed on Dec. 11, 2017, which is herein incorporated by reference in its entirety, and claims priority under 35 U.S.C. § 119(e) to U.S. Provisional Application Ser. No. 62/558,375, entitled "N-TYPE LOW-DROPOUT REGULATOR WITH POWER-RECYCLE AND INHERENT-VOLTAGE-CLAMPING TECHNIQUE FOR SHORT-PERIOD LOAD TRANSIENT" filed on Sep. 14, 2017, which is herein incorporated by reference in its entirety.

BACKGROUND

Voltage regulators are electronic circuits designed to provide stable direct current (DC) voltages independent of the load current, temperature and alternate current (AC) line voltage variations. A voltage regulator may use a simple feed-forward design or may include a negative feedback.

BRIEF SUMMARY

Some embodiments relate to an electronic system comprising a memory unit; a voltage regulator comprising: an operational amplifier having an output terminal; a signal buffer coupled to the output terminal of the operational amplifier, the signal buffer having at least first and second terminals; and an output transistor having an input terminal, and an output terminal coupled to the memory unit, the input terminal of the output transistor being coupled to the first terminal of the signal buffer and the output terminal of the output transistor being coupled to the second terminal of the signal buffer.

Other embodiments relate to a voltage regulator comprising an operational amplifier having an output terminal; a signal buffer coupled to the output terminal of the operational amplifier, the signal buffer having at least first and second terminals; and an output transistor having an input terminal and an output terminal, the input terminal of the output transistor being coupled to the first terminal of the signal buffer and the output terminal of the output transistor being coupled to the second terminal of the signal buffer.

Yet other embodiments relate to a method for regulating an output voltage provided to a load, the method comprising when the load is accessed, providing the output voltage to the load with a voltage regulator comprising a signal buffer and an output transistor; and when the load is in an idle mode, regulating the output voltage by clamping, with the signal buffer, a voltage at a gate terminal of the output transistor to the output voltage.

The foregoing summary is provided by way of illustration and is not intended to be limiting.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing.

DETAILED DESCRIPTION

Voltage regulators are electronic devices configured to provide constant voltages to loads independent of the current drawn by the load. Certain loads, however, are arranged to draw a substantial amount of current at certain times, and to draw no current (or very small currents) at other times. Such variability in the current drawn by the load may cause significant overshoots in the voltage provided to the load by the voltage regulator. In some circumstances, these overshoots may be so serious as to negatively affect the operations of the load. One such type of loads are memory units, such as dynamic random access memories (DRAM), embedded Multi-Media Controller (eMMC) memories and universal flash storage (UFS) memories, which switch from an access mode to an idle mode. In the access mode, the memory unit draws a substantial amount of current to enable read/write operations. In the idle mode, however, no read or write operations are performed, and as a result virtually no currents are drawn.

The inventors have developed voltage regulators configured to limit the output voltage overshoot arising when a load switches from a mode in which virtually no current is drawn to a mode in which a significant amount of current is drawn (or vice versa), or more in general when the current drawn by a load exhibits a substantial increase or decrease. Some embodiments relate to a voltage regulator for providing a reference voltage to a memory unit or other types of load, having an operational amplifier, an output transistor and a signal buffer connected therebetween. The voltage regulator may be configured such that, when the load is accessed, a certain output voltage is provided to the load that depends on the internal parameters of the voltage regulator. When the load is in an idle mode, the voltage regulator may be configured to clamp, using the signal buffer, the voltage at the gate of the output transistor to the output voltage. In this way, the extent to which the gate voltage varies when the load switches from the idle to the access mode is decreased, relative to some other voltage regulators. In some embodiments, this reduction in the variation of the gate voltage arising from a mode change may cause a reduction in the duration and amplitude of the output voltage overshoot.

Figure 1A:
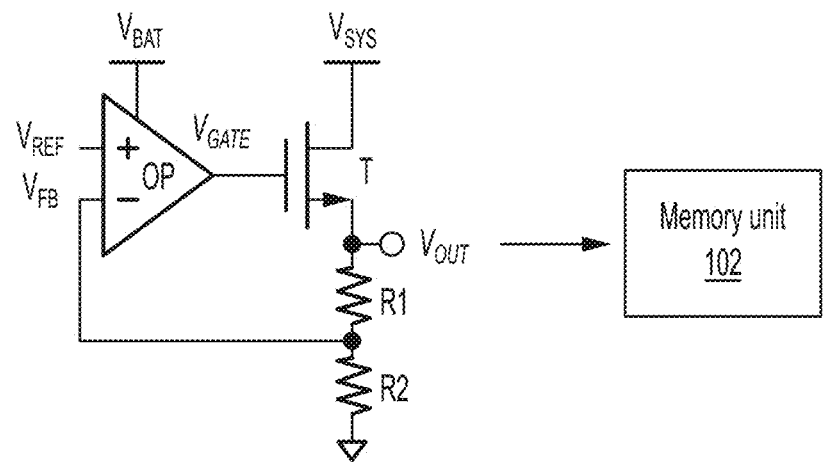
FIG. 1A is a circuit diagram illustrating a voltage regulator.

FIG. 1A is a circuit diagram illustrating a voltage regulator. Voltage regulator 100 includes an operational amplifier (OP), a transistor (T) and resistors R1 and R2. Operational amplifier OP is powered by a voltage supply $V_{BAT}$ and a voltage supply $V_{SYS}$ is provided to transistor T. Voltage regulator 100 is used to provide a constant reference voltage $V_{OUT}$ to a memory unit 102. Accordingly, the output terminal of the voltage regulator ($V_{OUT}$) is coupled to memory unit 102.

Voltage regulator 100 is arranged to stabilize the reference voltage $V_{REF}$ provided as input to the "+" input terminal of operational amplifier OP, thereby outputting a stabilized voltage $V_{OUT}$. The voltage stabilization may be performed, for example, to counteract variations in the load current or temperature. The resistances of resistors R1 and R2 are set to provide a desired voltage division, as the output voltage is equal to $V_{OUT}=V_{REF}(1+R1/R2)$. Changes in $V_{OUT}$ are counteracted using the control signal $V_{GATE}$ to control the conduction of the transistor T.

Figure 1B:
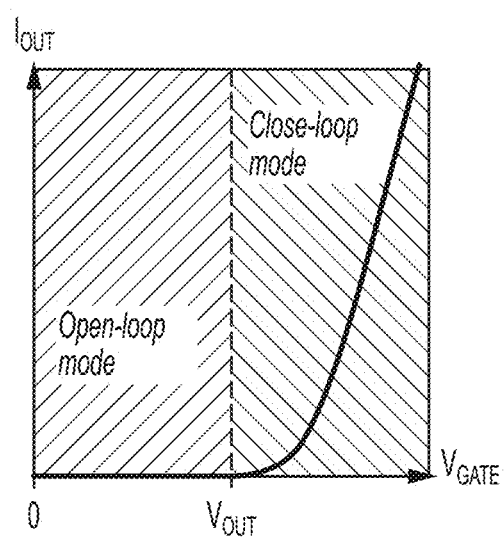
FIG. 1B is a plot illustrating the current-voltage characteristic of the voltage regulator of FIG. 1A.

The $V_{GATE}/T_{OUT}$ characteristic of the voltage regulator 100 is illustrated in FIG. 1B, where $I_{OUT}$ is the current provided to memory unit 102. As illustrated, $I_{OUT}$ is substantially equal to zero when $V_{GATE}$ is less than $V_{OUT}$ and increases in an exponential fashion when $V_{GATE}$ exceeds $V_{OUT}$. The case in which $V_{GATE}<V_{OUT}$ is referred to as the "open-loop mode" to indicate that the voltage regulator is effectively operating without a feedback. The case in which $V_{GATE}>V_{OUT}$ is referred to as the "close-loop mode" to indicate that voltage regulator is operating with a feedback ($V_{FB}$) to counteract variations in the load current.

The inventors have appreciated that these types of voltage regulators are not suitable for use with memory units that alternate between an access mode (in which the memory is accessed for example to perform a read or write operation) and an idle mode (in which no read or write operations are performed on the memory). In these circumstances, in fact, the amount of current drawn by the memory unit varies substantially. In the access mode, a significant amount of current is drawn to enable the read or write operation, while no current is drawn in the idle mode. The inventors have appreciated that when the current drawn by the memory unit varies in this manner, the voltage regulator's ability to supply a constant output voltage is significantly diminished.

Figure 1C:
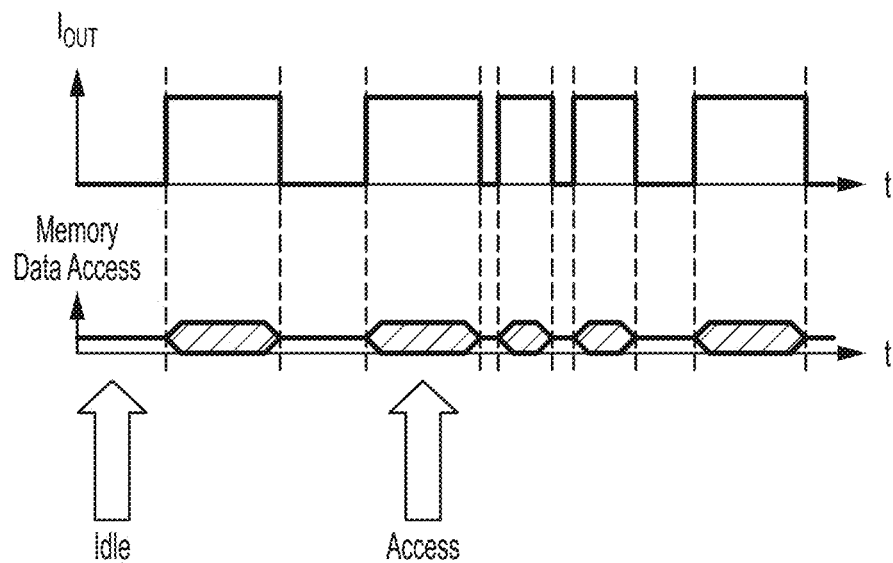
FIG. 1C is a plot illustrating how the output current of the voltage regulator of FIG. 1A varies in response to a sequence of memory access operations.
Figure 1D:
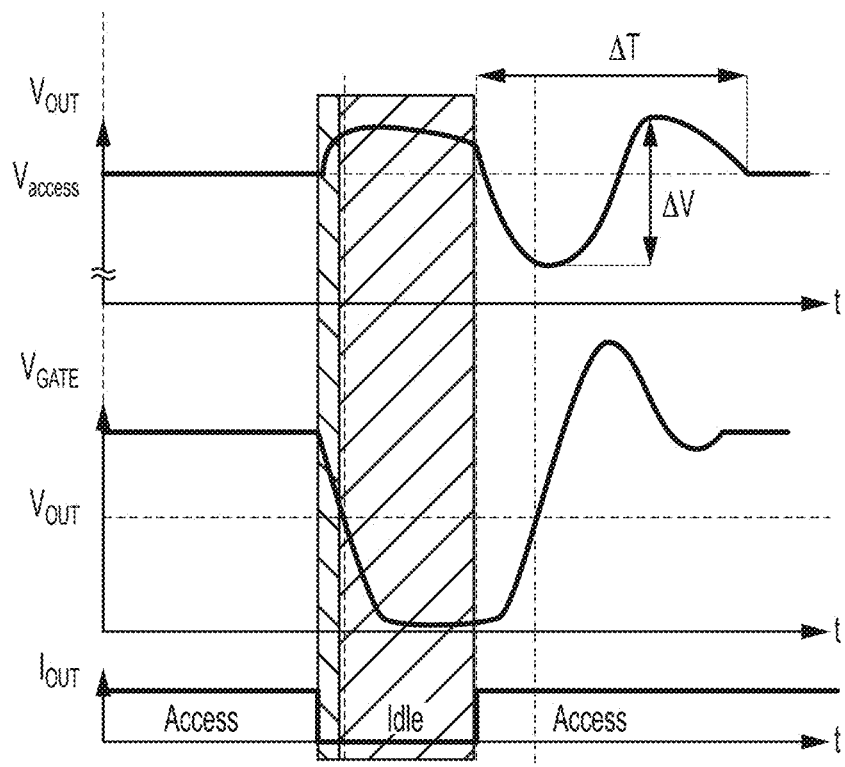
FIG. 1D is a plot illustrating how the output voltage of the voltage regulator of FIG. 1A varies when a memory unit is idled.

FIG. 1C is a plot illustrating how the $I_{OUT}$ varies depending on whether the memory unit is in the access or idle mode. As shown, the current drawn by the memory unit ($I_{OUT}$) is substantially zero in the idle mode, and is greater than zero in the access mode. FIG. 1D is a plot illustrating how $V_{GATE}$ and $V_{OUT}$ vary depending on $I_{OUT}$. In this example, the memory unit is initially in the access mode. As a result, the output voltage $V_{OUT}$ is constant and equal to a certain value $V_{access}$ (which may depend on R1, R2 and $V_{REF}$). Correspondingly, $V_{GATE}$ is constant and greater than $V_{OUT}$, thus maintaining the voltage regulator 100 in the close-loop mode. When the memory unit ceases to be accessed and enters the idle mode, $I_{OUT}$ drops to zero. Consequently, voltage regulator 100 experiences a power surplus, and $V_{OUT}$ overshoots. The result is that $V_{FB}$ rises above $V_{REF}$, $V_{GATE}$ decays and the voltage regulator 100 decreases its supply of current. When the memory unit is again accessed, $V_{GATE}$ begins to increase to support the output current. However, $V_{GATE}$ overshoots prior to reaching the desired constant value. The result is that $V_{OUT}$ also overshoots prior to reaching again $V_{access}$. The duration of $V_{OUT}$'s overshoot is referred to as $\Delta T$ and the amplitude of $V_{OUT}$'s overall variation is referred to as $\Delta T$. In some circumstances, $\Delta T$ may be as high as 1 µs, and $\Delta V$ may be as high as 60 mV. The duration of the overshoot may, at least in some circumstances, limit the rate at which the memory unit can be accessed. The amplitude of the overshoot may, at least in some circumstances, destabilize the operations of the memory unit.

It should be appreciated that the term overshoot as used herein can indicate a signal going beyond above or below the expected level.

The inventors have developed voltage regulators designed to substantially decrease the duration and the amplitude of the output voltage overshoot when the memory unit switches between the idle and the access mode, and vice versa. Some embodiments are directed to a voltage regulator configured such that $V_{GATE}$ is clamped to a constant value substantially equal to $V_{OUT}$ when the memory unit is in the idle mode. Clamping $V_{GATE}$ in this manner may cause the voltage regulator to stay in the close-loop mode, which in turn may attenuate the extent and the duration of $V_{OUT}$'s overshoot.

Figure 2:
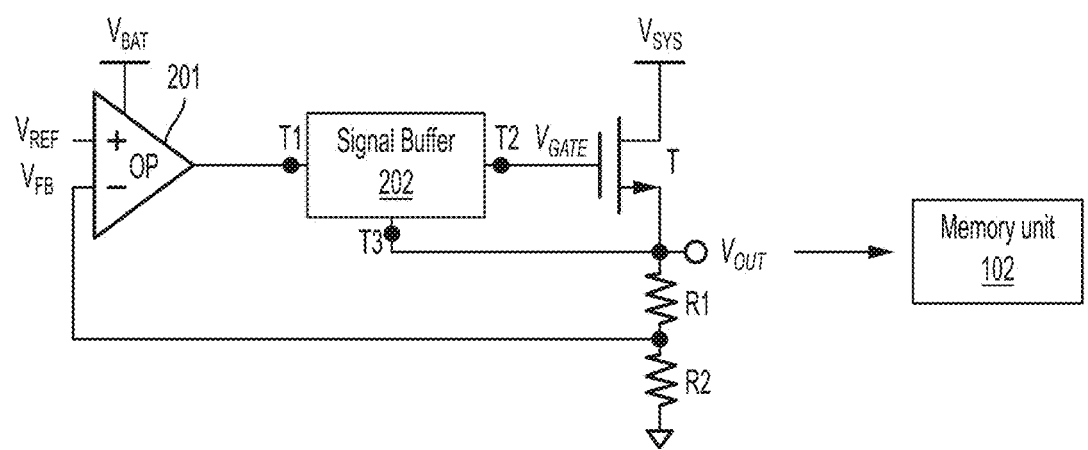
FIG. 2 is a circuit diagram illustrating a voltage regulator including a signal buffer coupled to the output of the voltage regulator, according to some non-limiting embodiments.

A voltage regulator configured to clamp $V_{GATE}$ in this manner is illustrated in FIG. 2, according to some non-limiting embodiments. Voltage regulator 200 may include operational amplifier 201, transistor T, resistors R1 and R2, and signal buffer 202. The output voltage $V_{OUT}$ of voltage regulator 200 may be provided as a reference voltage to a memory unit 102, for example to enable read and write operations. Memory unit 102 may include any suitable type of memory, including but not limited to DRAM, eMMC, and UFS. It should be appreciated that the voltage regulator of FIG. 2 may be used in connection with loads other than memory units, as the application is not limited in this respect Similar to the memory units described herein, some such loads may draw current in an intermittent fashion.

Operational amplifier 201 may be implemented in any suitable way, including as a single gain stage amplifier or multiple gain stage amplifier. Operational amplifier 201 may have a single ended output (as illustrated in FIG. 2) or a differential output. Operational amplifier 201 may be implemented using any suitable type of transistors, including for example metal-oxide-semiconductor field-effect-transistors (MOSEFET) and bipolar junction transistors (BJT). Among other circuits, operational amplifier 201 may comprise a differential amplifier, for example as the input stage, a voltage amplifier such as a class-A amplifier, and/or an output amplifier such as a class-AB amplifier.

Transistor T may be a MOSEFET, a BJT, or any other suitable type of transistor. Transistor T may be arranged such that the drain (or collector) is coupled to $V_{SYS}$, and the source (or emitter) is coupled to the voltage regulator's output terminal ($V_{OUT}$). Signal buffer 202 may have a first terminal T1 coupled to an output terminal of the operational amplifier OP, a second terminal T2 coupled to an input terminal (e.g., the gate) of transistor T, and a third terminal T3 coupled to the output terminal ($V_{OUT}$) of voltage regulator 200. In some embodiments, terminal T1 may serve as an input terminal of the signal buffer 202 and terminal T2 as an output terminal of the signal buffer 202.

Signal buffer 202 may be configured such that, when memory unit 102 is in idle mode (e.g., memory unit 102 draws a current value that is below 1 µA or below 100 nA), $V_{GATE}$ is clamped to $V_{OUT}$ (e.g., is substantially equal to $V_{OUT}$). In some embodiments, signal buffer 202 may have a voltage gain that is less than 1. In some embodiments, signal buffer 202 may exhibit a high input impedance at terminal T1 and a low output impedance (at the terminal T2 and/or the terminal T3). For example, signal buffer 202 may have an input impedance between 100 KΩ and 100 MΩ, between MΩ and 100 MΩ, between 10 MΩ and 100 MΩ, between 100 KΩ and 1 MΩ, or between 1 MΩ and 10 MΩ, and an output impedance between 10Ω and 10 KΩ, between 100Ω and 10 KΩ, between 1 KΩ and 10 KΩ, between 1000 and 1 KΩ, or between 1 KΩ and 10 KΩ.

Figure 3:
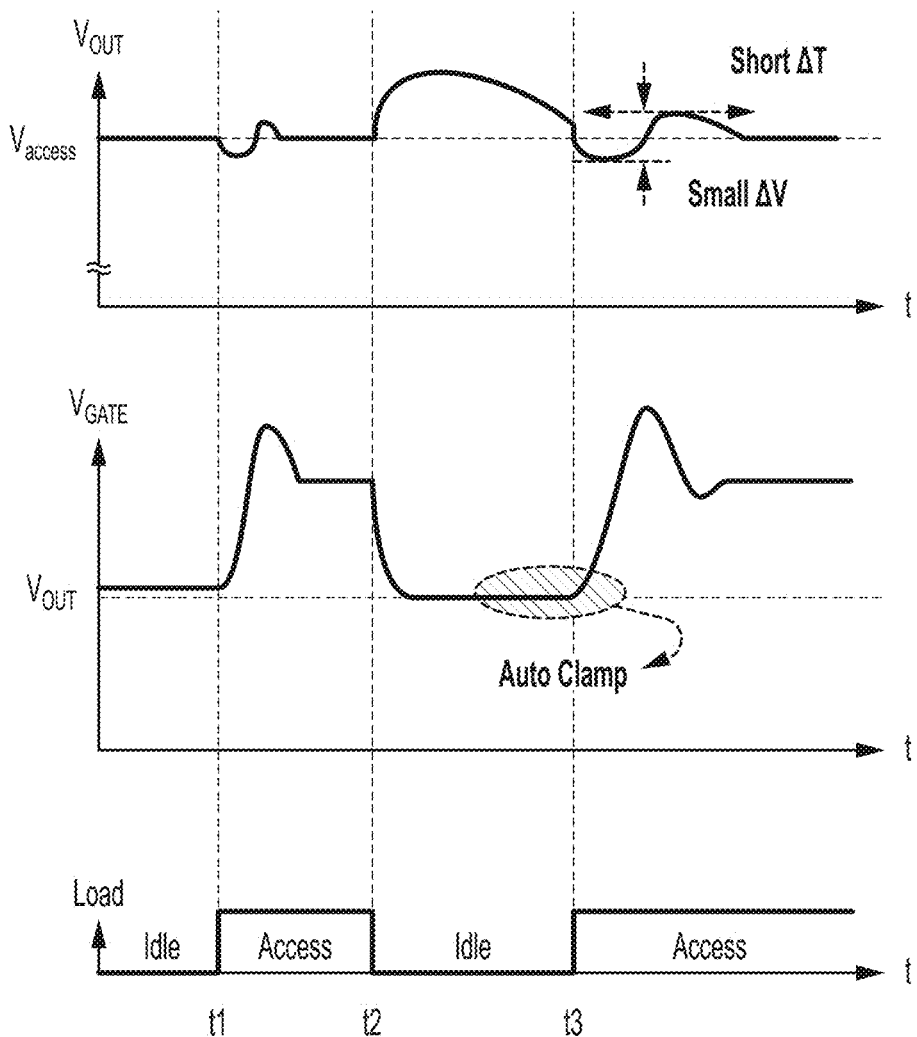
FIG. 3 is a plot illustrating an example of how the output voltage of the voltage regulator of FIG. 2 may vary when a memory unit is idled, according to some non-limiting embodiments.

FIG. 3 is a plot illustrating an example of how $V_{GATE}$ and $V_{OUT}$ may vary as memory unit 102 is switched between an idle mode and an access mode. In this case, prior to t=t1, the memory unit 102 is an idle mode. During this period, $V_{OUT}$ is equal to $V_{access}$ (whose value may depend upon R1, R2 and $V_{REF}$, among other possible parameters) and $V_{GATE}$ is clamped to $V_{OUT}$. At t=t1, the memory unit 102 is accessed (for example with a read or write operation). In response, $V_{GATE}$ increases over $V_{OUT}$ to support the current drawn by the memory unit.

At t=t2, the memory unit enters again the idle mode. As a result, $V_{OUT}$ overshoots, $V_{FB}$ rises above $V_{REF}$, and $V_{GATE}$ decays. $V_{GATE}$ continues to decreases until it reaches $V_{OUT}$. Following this point, signal buffer 202 causes $V_{GATE}$ to clamp to $V_{OUT}$. Between t=t2 and t=t3, $V_{OUT}$ overshoots being $V_{FB}>V_{REF}$.

At t=t3, the memory unit 102 is accesses again. As a result, $V_{GATE}$ increases over $V_{OUT}$ and $V_{OUT}$ exhibits an overshoot. It should be appreciated, however, that the amplitude and duration of $V_{OUT}$'s overshoot are substantially lower, relative to the case of FIG. 1D. This is due to the fact that $V_{GATE}$ starts its ascend from $V_{OUT}$, rather than from below $V_{OUT}$ as in voltage regulator 100, thus limiting the overall extent of $V_{GATE}$'S ascend. In this case, the amplitude of the overall variation ΔV may be less than 20 mV, and the duration of the overshoot ΔT may be less than 0.01 μs. The duration ΔT and amplitude ΔV may be significantly lower than in voltage regulator 100, thus significantly improving the memory unit's ability to quickly switch between the access mode and the idle mode, and vice versa, and to provide a stable reference voltage.

Figure 4:
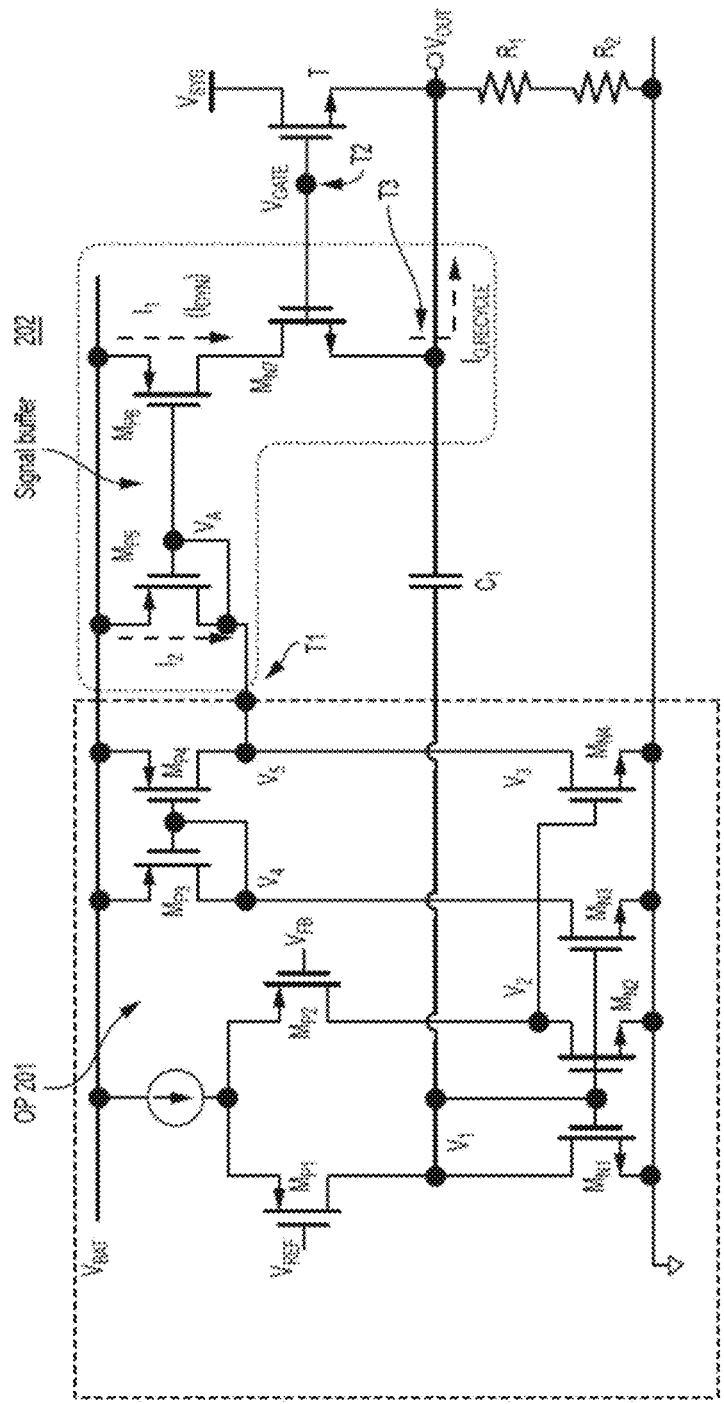
FIG. 4 is a circuit diagram illustrating a representative implementation of the voltage regulator of FIG. 2, according to some non-limiting embodiments.

A possible implementation for voltage regulator 200 is illustrated in FIG. 4, according to some embodiments. In this implementation, operational amplifier 201 comprises transistors $M_{P1}$ $M_{P2}$, $M_{P3}$, $M_{P4}$, $M_{N1}$, $M_{N2}$, $M_{N3}$, $M_{N4}$, $M_{N5}$, and $M_{N6}$, and signal buffer 202 comprises transistors $M_{P5}$, $M_{P6}$, $M_{N7}$, resistor R3 and current generator $I_{B1}$. Transistor $M_F$ and capacitors C1 and C2 serve as a feedback network between the output terminal of the voltage regulator and the "−" terminal of operational amplifier OP.

As illustrated, transistors $M_{P5}$ and $M_{P6}$, arranged in a current mirror configuration, serve as the signal buffer's input stage, and provide the desired high input impedance. Transistor $M_{N7}$ has a gate terminal coupled to the gate terminal of output transistor T, a source (or emitter, depending on the transistor type) terminal coupled to the output terminal ($V_{OUT}$) of the voltage regulator and a drain terminal coupled to transistor $M_{P6}$. This arrangement is particularly energy efficient because at least part of the current flowing into the current mirror ($I_1$) is recycled at the output ($I_Q$, recycle), and may be used for driving the memory unit or other loads connected to the voltage regulator.

It should be noted that, at least in some embodiments, neither the second terminal (T2) nor the third terminal ($T_3$) of the signal buffer is connected directly to a ground terminal. This is to prevent the gate $V_{GATE}$ or output voltage VOUT to be clamped to zero.

Figure 5A:
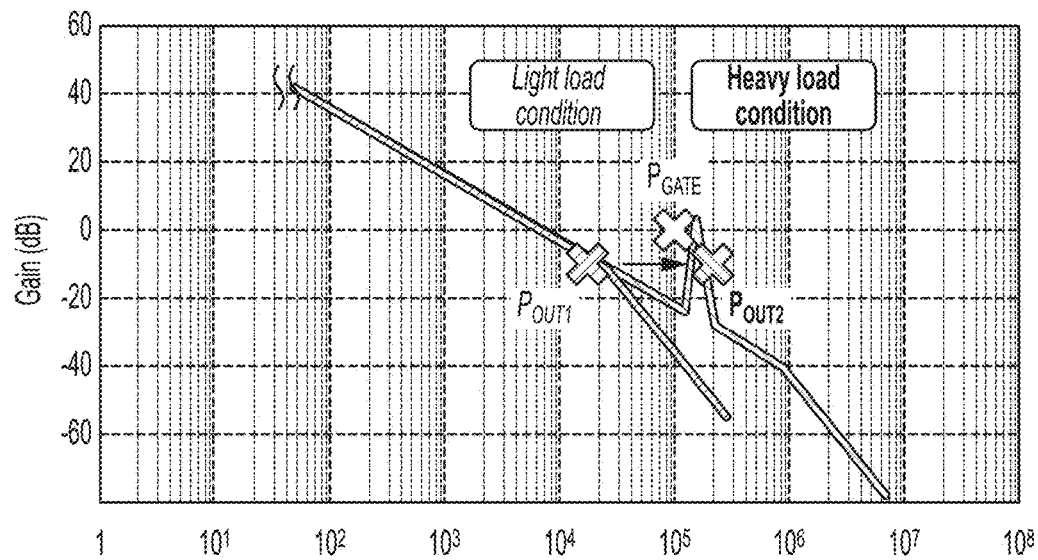
FIG. 5A is a plot illustrating the frequency response of the voltage regulator of FIG. 1A.

The inventors have appreciated that some voltage regulators, such as the voltage regulator of FIG. 1A, suffer from the presence of resonant frequencies in their frequency response. A resonant frequency arises when two or more poles are close to each other (e.g., within a factor 2 or 3). If a voltage regulator that exhibits one such resonant frequency it excited at such a frequency, uncontrolled oscillating signals may arise which may negatively affect the stability of the voltage regulator. FIG. 5A is a plot illustrating the frequency response of a the voltage regulator of FIG. 1A. When the voltage regulator operates under light load condition (e.g., the load draws negligible current, such as less than 1 μA), the frequency response exhibits two poles: $P_{OUT1}$ and $P_{GATE}$. $P_{OUT1}$ is the pole arising at the output terminal of the voltage regulator and $P_{GATE}$ is the pole arising at the gate of transistor T. When the voltage regulator operates under heavy load condition (e.g., the load draws more than 1 μA), the location of the output terminal pole moves from $P_{OUT1}$ to $P_{OUT2}$ due to the increase in the output current. The result is that $P_{OUT2}$ moves closer to $P_{GATE}$ (in this case $P_{GATE}$ is 10 KHz and $P_{OUT2}$ is 20 KHz), and a resonant frequency (a peak in the frequency response) arises.

Figure 5B:
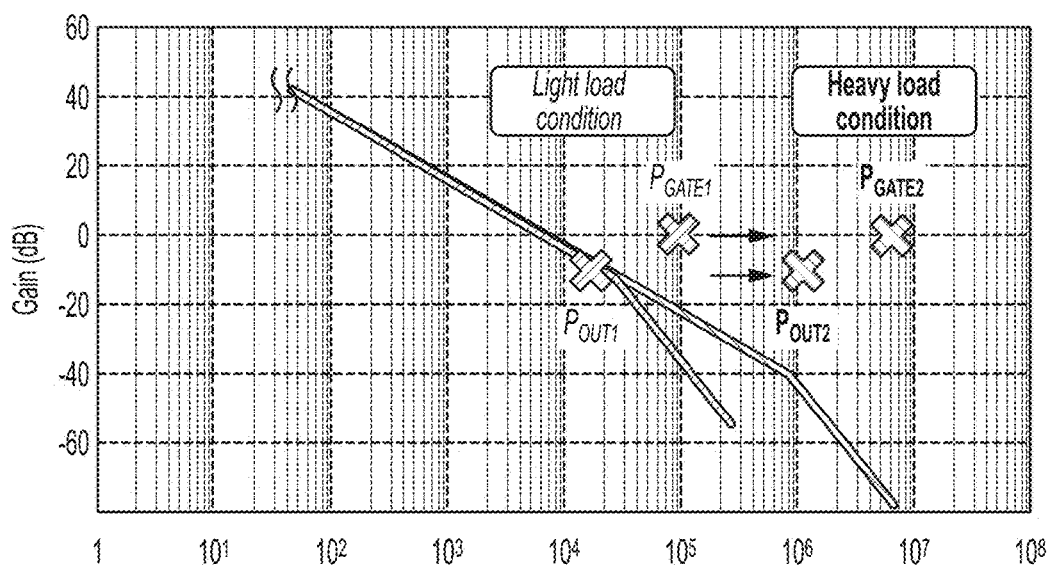
FIG. 5B is a plot illustrating the frequency response of a voltage regulator of the types described herein, according to some non-limiting embodiments.

In some embodiments, the formation of resonant frequencies may be prevented by allowing the location of the gate pole to move when the load current is increased. In this way, even if the output terminal pole moves closer to the gate pole, the gate pole may simultaneously move away from its light load condition value, thus preventing the poles from getting too close to each other. In some embodiments, the extent to which the gate pole moves under heavy load condition may be controlled by setting the output impedance at the gate terminal of transistor T. For example, the lower the impedance, the more the pole moves toward larger frequencies. A representative illustration of this effect is depicted in FIG. 5B, according to some non-limiting embodiments. As in the case of FIG. 5A, the output pole moves from $P_{OUT1}$ to $P_{OUT2}$ as the voltage regulator transitions from the light load condition to the heavy load condition. Unlike the case of FIG. 5A, however, the gate terminal pole moves as well (from $P_{GATE1}$ to $P_{GATE2}$) The extent to which this pole moves may depend, among other parameters, on how low the output impedance at the gate terminal is. As illustrated, no resonant frequencies arise in the frequency response of FIG. 5B, and as a result undesired instabilities are prevented.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including", "comprising", "having", "containing" or "involving" and variations thereof herein, is meant to encompass the items listed thereafter and equivalents thereof as well as additional items.

The use of "coupled" or "connected" is meant to refer to circuit elements, or signals, that are either directly linked to one another or through intermediate components.

The terms "approximately", "substantially," and "about" may be used to mean within ±20% of a target value in some embodiments, within ±10% of a target value in some embodiments, within ±5% of a target value in some embodiments, and within ±2% of a target value in some embodiments. The terms "approximately" and "about" may include the target value.

What is claimed is:

1. An electronic system comprising:
  a memory unit;
  a voltage regulator comprising:
    an operational amplifier having an output terminal;
    a signal buffer coupled to the output terminal of the operational amplifier, the signal buffer having at least first and second terminals; and
    an output transistor having an input terminal, and an output terminal coupled to the memory unit, the input terminal of the output transistor being coupled to the first terminal of the signal buffer and the output terminal of the output transistor being coupled to the second terminal of the signal buffer,
    wherein the signal buffer is configured to set a voltage at the input terminal of the output transistor to be substantially equal to a voltage at the output terminal of the output transistor in response to an overshoot in the voltage at the output terminal of the output transistor.

2. The electronic system of claim 1, wherein the operational amplifier has an input terminal coupled, through a resistive element, to the output terminal of the output transistor.

3. The electronic system of claim 1, wherein the signal buffer exhibits a voltage gain that is less than 1.

4. A voltage regulator comprising:
  an operational amplifier having an output terminal;
  a signal buffer coupled to the output terminal of the operational amplifier, the signal buffer having at least first and second terminals; and
  an output transistor having an input terminal and an output terminal, the input terminal of the output transistor being coupled to the first terminal of the signal buffer and the output terminal of the output transistor being coupled to the second terminal of the signal buffer,
  wherein the signal buffer is configured to set a voltage at the input terminal of the output transistor to be substantially equal to a voltage at the output terminal of the output transistor in response to an overshoot in the voltage at the output terminal of the output transistor.

5. The voltage regulator of claim 4, wherein the operational amplifier has an input terminal coupled, through a resistive element, to the output terminal of the output transistor.

6. The voltage regulator of claim 4, wherein the signal buffer exhibits a voltage gain that is less than 1.

7. The voltage regulator of claim 4, wherein the signal buffer comprises a current mirror.

8. The voltage regulator of claim 7, wherein a first terminal of the current mirror is coupled to the output terminal of the operational amplifier and a second terminal of the current mirror is coupled to the output terminal of the output transistor.

9. The voltage regulator of claim 8, wherein the second terminal of the current mirror is coupled to the output terminal of the output transistor through a transistor.

10. The voltage regulator of claim 4, wherein the output terminal of the output transistor is coupled to a memory unit.

11. The voltage regulator of claim 4, wherein the input terminal of the output transistor is a gate terminal and the output terminal of the output transistor is a source or emitter terminal.

12. The voltage regulator of claim 4, wherein neither the first terminal of the signal buffer nor the second terminal of the signal buffer is coupled to ground.

13. The voltage regulator of claim 4, wherein the output transistor is a MOSFET.

14. The voltage regulator of claim 13, wherein the MOSFET is arranged in a common-drain or common-collector configuration.

15. A method for regulating an output voltage provided to a load, the method comprising:
  when the load is accessed, providing the output voltage to the load with a voltage regulator comprising a signal buffer and an output transistor; and
  when the load is in an idle mode, regulating the output voltage by clamping, with the signal buffer, a voltage at a gate terminal of the output transistor to the output voltage
  wherein clamping the voltage at the gate terminal of the output transistor to the output voltage comprises causing the voltage at the gate terminal of the output transistor to be substantially equal to the output voltage.

16. The method of claim 15, wherein:
  when accessed, the load draws a first current value from the voltage regulator; and
  when in the idle mode, the load draws a second current value from the voltage regulator, the first current value being greater, in absolute value, than the second current value.

17. The method of claim 15, wherein the load comprises a memory unit, and wherein, when the load is accessed, a read and/or write operation is performed on the memory unit.

* * * * *